(12) United States Patent
Chien

(10) Patent No.: US 8,722,452 B2
(45) Date of Patent: May 13, 2014

(54) METHOD OF FORMING OPTOELECTRONIC CONVERSION LAYER

(75) Inventor: Yi-Jiunn Chien, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 107 days.

(21) Appl. No.: 13/400,557

(22) Filed: Feb. 20, 2012

(65) Prior Publication Data

US 2013/0029452 A1 Jan. 31, 2013

(30) Foreign Application Priority Data

Jul. 26, 2011 (TW) .............................. 100126455 A

(51) Int. Cl.
*H01L 31/18* (2006.01)

(52) U.S. Cl.
USPC .......................................................... 438/93

(58) Field of Classification Search
USPC .......................................................... 438/93
See application file for complete search history.

(56) References Cited

U.S. PATENT DOCUMENTS

| | | | |
|---|---|---|---|
| 6,500,733 B1 | 12/2002 | Stanbery | |
| 6,559,372 B2 | 5/2003 | Stanbery | |
| 6,720,239 B2 * | 4/2004 | Stanbery | 438/459 |
| 6,736,986 B2 | 5/2004 | Stanbery | |
| 6,797,874 B2 | 9/2004 | Stanbery | |
| 6,881,647 B2 | 4/2005 | Stanbery | |
| 2003/0052382 A1 * | 3/2003 | Stanbery | 257/436 |
| 2003/0052391 A1 * | 3/2003 | Stanbery | 257/635 |
| 2003/0054582 A1 * | 3/2003 | Stanbery | 438/46 |
| 2003/0054662 A1 * | 3/2003 | Stanbery | 438/763 |
| 2003/0054663 A1 | 3/2003 | Stanbery | |
| 2011/0207297 A1 | 8/2011 | Yaginuma | |
| 2012/0196131 A1 * | 8/2012 | Eldada | 428/411.1 |
| 2013/0164916 A1 * | 6/2013 | Liang et al. | 438/478 |
| 2013/0164918 A1 * | 6/2013 | Liang et al. | 438/478 |

FOREIGN PATENT DOCUMENTS

| | | |
|---|---|---|
| CN | 102163632 A | 8/2011 |
| EP | 1 746 662 A1 | 1/2007 |
| WO | 2007082080 A1 | 7/2007 |

* cited by examiner

*Primary Examiner* — Charles Garber
*Assistant Examiner* — Stanetta Isaac
(74) *Attorney, Agent, or Firm* — Winston Hsu; Scott Margo

(57) ABSTRACT

A method of forming optoelectronic conversion layer includes the following steps. A first substrate is provided, and an electrode layer is formed on the first substrate. A first metal precursor layer including one or plural of metal components is formed on the electrode layer. A second substrate is provided, and a nonmetal precursor layer including at least one nonmetal component is formed on the second substrate. The first substrate and the second substrate are then stacked so that the nonmetal precursor layer and the first metal precursor layer are in contact. A thermal treatment is performed to have the first metal precursor layer react with the nonmetal precursor layer for forming an optoelectronic conversion layer.

22 Claims, 10 Drawing Sheets

| 28 |
|---|
| 26 |

FIG. 3

METHOD OF FORMING OPTOELECTRONIC CONVERSION LAYER

BACKGROUND OF THE INVENTION

1. Field of the Invention

This invention generally relates to a method of forming an optoelectronic conversion layer. More particularly, the present invention relates to a method including a process of stacking a metal precursor layer with a nonmetal precursor layer and a thermal treatment to have the metal precursor layer react with the nonmetal precursor layer and thereby obtain an optoelectronic conversion layer.

2. Description of the Prior Art

Optoelectronic conversion layers, which can absorb light of specific frequency and convert it into electric energy, are widely used as light absorption layers in solar cells or photosensitive layers in photosensors.

Usually, materials used in current optoelectronic conversion layers may comprise copper-indium-gallium-selenide alloys, which can be mainly fabricated by two methods: one by co-evaporation and the other one by sputtering, combined with a selenization step. Both methods, however, have their own drawbacks. The co-evaporation method, for example, is only suitable for small-scale devices. When the co-evaporation is applied in a fabrication of large-level devices, CIGS alloys formed by this method may have poor distribution uniformity and therefore produce relatively low optoelectronic conversion efficiency. On the other hand, in the sputtering combined with selenization, the amount of gallium elements away from a substrate (or nearby a surface of the CIGS alloy) is relatively low, and the amount of gallium elements near the substrate (or away from the surface of the CIGS alloy) is relatively high because of a segregation of the gallium elements. Because of these drawbacks, an energy bandgap near a PN-junction would be relatively low and an open-circuit voltage ($V_{os}$) would also be reduced. Additionally, selenization is deemed as a non eco-friendly method, for it has to use toxic gases, i.e. hydrogen selenide ($H_2Se$).

SUMMARY OF THE INVENTION

To address these and other objectives, the present invention provides a method of forming an optoelectronic conversion layer which may improve the distribution uniformity of each component in an optoelectronic conversion layer and increase the optoelectronic conversion efficiency.

According to one embodiment of the invention, a method of forming an optoelectronic conversion layer includes the following steps: A first substrate is provided, and an electrode layer is formed on the first substrate. A first metal precursor layer including one or a plurality of metal components is formed on the electrode layer. A second substrate is provided, and a nonmetal precursor layer including at least one nonmetal component is formed on the second substrate. The first substrate and the second substrate are then stacked so that the nonmetal precursor layer and the first metal precursor layer are in contact. A thermal treatment is performed to have the first metal precursor layer react with the nonmetal precursor layer for forming an optoelectronic conversion layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 2-5 are schematic, cross-sectional diagrams showing a method for forming an optoelectronic conversion layer according to a first embodiment of the invention.

Figure 1:
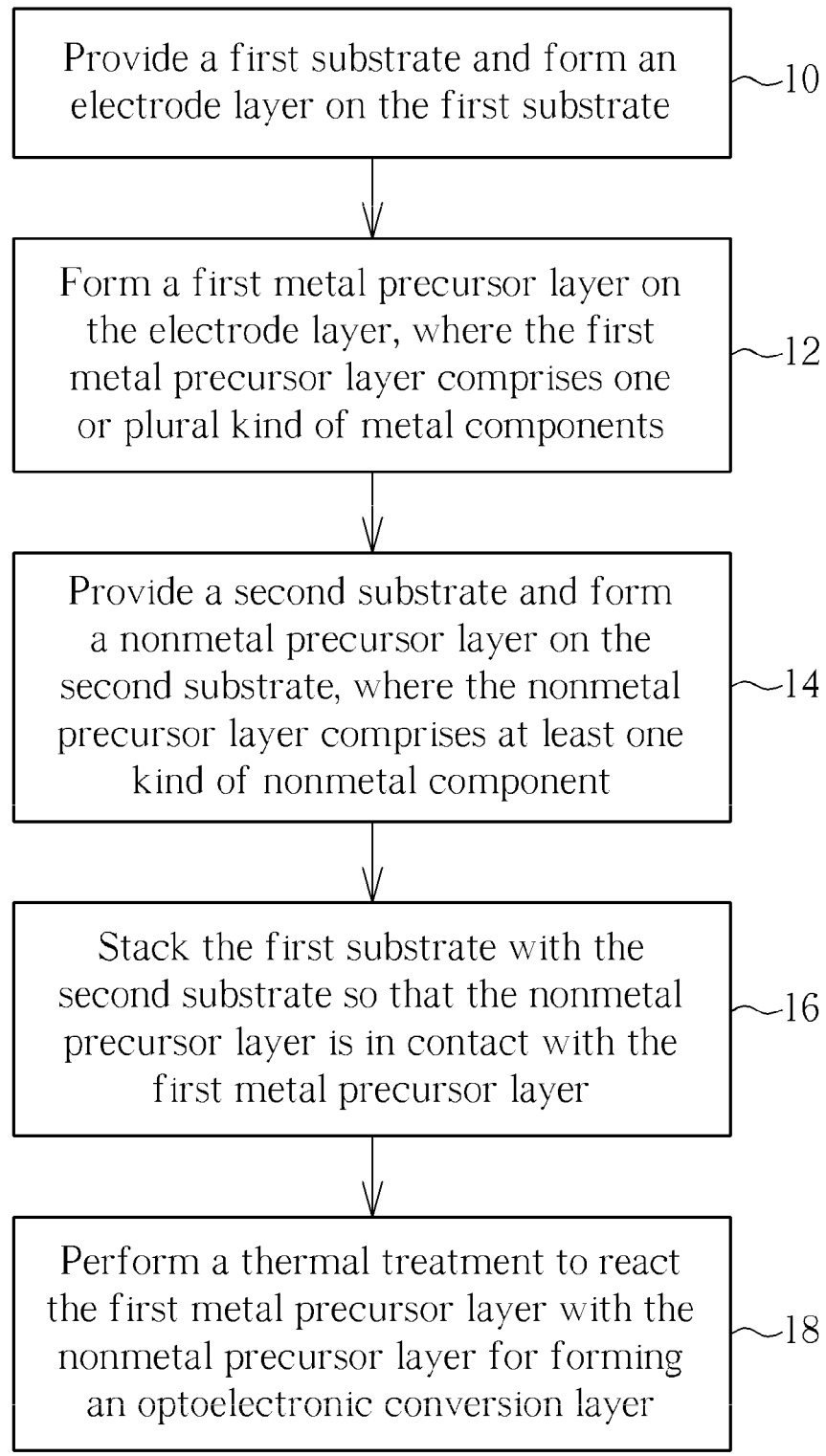
FIG. 1 is a flow chart illustrating a method for forming an optoelectronic conversion layer according to embodiments of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Please refer to FIG. 1, which is a flow chart illustrating a method for fabricating an optoelectronic conversion layer according to embodiments of the invention. As shown in FIG. 1, a method of forming an optoelectronic conversion layer in the present invention includes the following steps:

- step 10: provide a first substrate and form an electrode layer on the first substrate;
- step 12: form a first metal precursor layer on the electrode layer, where the first metal precursor layer comprises one or a plurality of metal components;
- step 14: provide a second substrate and form a nonmetal precursor layer on the second substrate, where the nonmetal precursor layer comprises at least one kind of nonmetal component;
- step 16: stack the first substrate and the second substrate so that the nonmetal precursor layer is in contact with the first metal precursor layer; and step 18: perform a thermal treatment to react the first metal precursor layer with the nonmetal precursor layer for forming an optoelectronic conversion layer.

The method of forming an optoelectronic conversion layer comprises forming a first metal precursor layer on a first substrate and forming a nonmetal precursor layer on a second substrate separately. Then, the first substrate is stacked with the second substrate so that the first metal precursor layer is in direct contact with the nonmetal precursor layer. Finally, a thermal treatment is carried out so that the first metal precursor layer can react with the nonmetal precursor to thereby form an optoelectronic conversion layer. The method illustrated in this invention may be applied in a fabrication process for large-scale devices. The distribution uniformity of each component in the optoelectronic conversion layer may also be improved, which therefore will improve the optoelectronic conversion efficiency as well. The following paragraph will be focused on the method of forming the optoelectronic conversion layer according to several embodiments of the invention.

Figure 2:
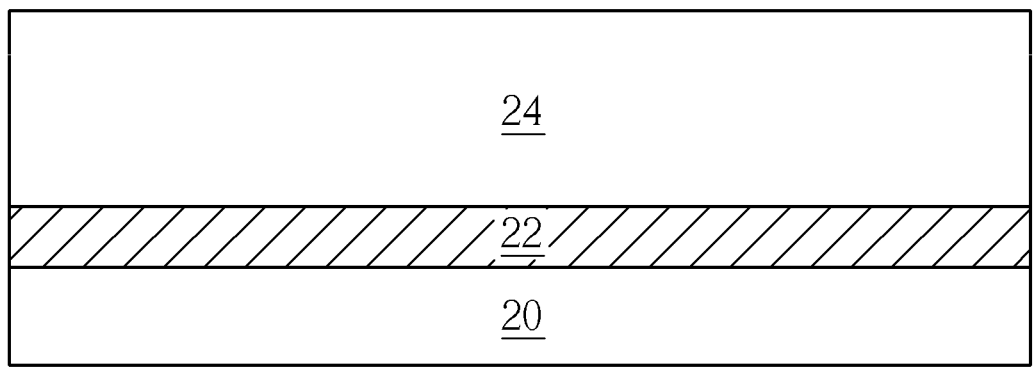

Please refer to FIGS. 2-5, which are schematic, cross-sectional diagrams showing a method for fabricating an optoelectronic conversion layer according to a first embodiment of the invention. As shown in FIG. 2, a first substrate 20 is provided and an electrode layer 22 is formed on it. The first substrate 20 may preferably comprise a soda-lime glass (SLG) substrate, but is not limited thereto. The electrode layer 22 may comprise a metal electrode, such as a molybdenum (Mo) electrode, but is not limited thereto. In addition, the electrode layer 22 may be a single-layered or a multi-layered structure. Next, a first metal precursor layer 24 is formed on the electrode layer 22. The first metal precursor layer 24 may comprise a plurality of metal components. For example, in this embodiment, the first metal precursor layer 24 comprises at least a group B metal element (any metal element in groups 3-12 (groups IB-VIIIB)), but is not limited thereto. In addition, in this embodiment, the first metal precursor layer 24 may be a single-layered metal precursor layer, which, for instance, may be an alloy precursor layer. Metal components in the first metal precursor layer 24 may include indium (In), copper (Cu) and gallium (Ga), that is to say, the metal precursor layer 24 may be a copper-indium-gallium alloy precursor layer. In another case, metal components in the first metal precursor layer 24 may include copper (Cu), zinc (Zn) and tin (Sn), so the metal precursor layer 24 may be a copper-zinc-tin alloy precursor layer, but is not limited thereto. Additionally, the first metal precursor layer 24 may be a single metal element precursor layer. For example, metal components in the first metal precursor layer 24 may comprise cadmium (Cd), so the first metal precursor layer 24 may be a cadmium precursor layer. In another embodiment, the first metal precursor layer 24 may also be a multi-layered metal precursor layer comprising several layers of metal precursor films. Each of the metal precursor films may be a single metal element precursor film or an alloy precursor film. Additionally, in this embodiment, the first metal precursor layer 24 is preferably formed through sputter processes, but is not limited thereto. The thickness of the first metal precursor layer 24 preferably ranges from 0.8 micrometer ($\mu m$) to 2 $\mu m$, such as 1.1 $\mu m$, but is not limited thereto.

Figure 3:
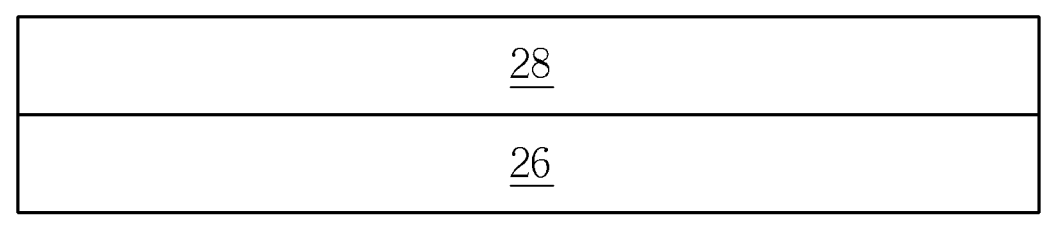

As shown in FIG. 3, a second substrate 26 is provided, and a nonmetal precursor layer 28 is formed on the second substrate 26. The second substrate 26 is preferably chosen from a soda-lime glass (SLG) substrate, but is not limited thereto; it may be selected from other kinds of substrates. The nonmetal precursor layer 28 comprises at least one nonmetal component, which may be chosen from nonmetal elements in group A (for example, any nonmetal element among groups 1-2 and 13-18 (groups IA-VIIIA)). The nonmetal component in the nonmetal precursor layer 28 may for example include selenium (Se) and the first metal precursor layer 24 may be a copper-indium-germanium alloy precursor layer in this case. In another embodiment, at least one nonmetal component in the nonmetal precursor layer 28 may include sulfur (S) and the first metal precursor layer 24 may be a copper-zinc-tin alloy precursor layer in this case, but is not limited thereto. In yet another embodiment, at least one nonmetal component in the nonmetal precursor layer 28 may include tellurium (Te) and the first metal precursor layer 24 may be a cadmium (Cd) precursor layer in this case, but is not limited thereto. Additionally, the nonmetal precursor layer 28 described in the above embodiments preferably ranges from 0.5 $\mu m$ to 2 $\mu m$ in thickness, such as 0.9 $\mu m$, but is not limited thereto.

Figure 4:
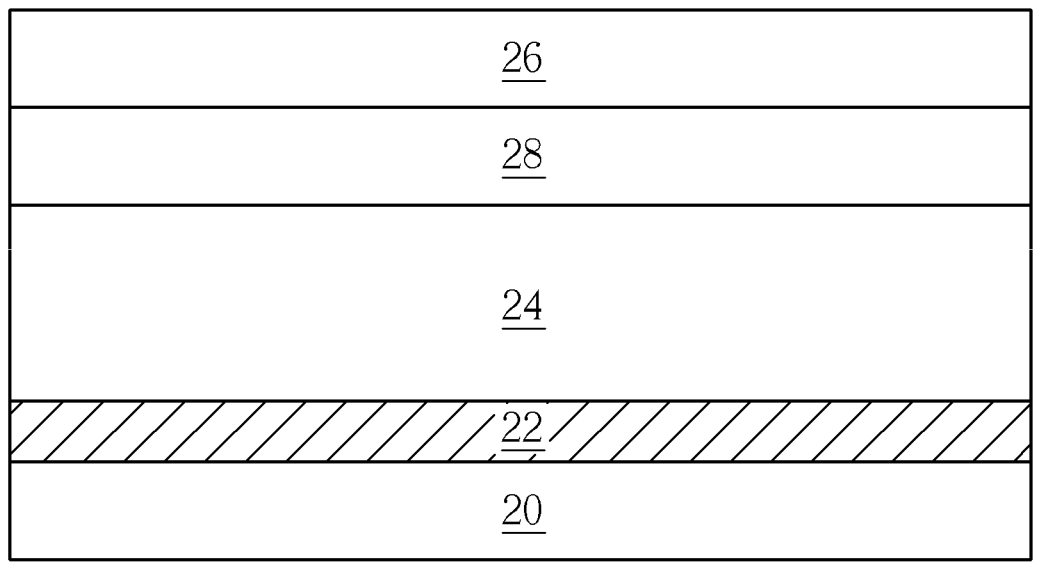

Please refer to FIG. 4. The first substrate 20 and the second substrate 26 are then stacked so that the first metal precursor layer 24 and the nonmetal precursor layer 28 are in contact. The method for stacking the first substrate 20 and the second substrate 26 is preferably carried out by rotating the second substrate 26 upside down and disposing its surface onto the first substrate 20 so that that the nonmetal precursor layer 28 can be stacked on the first metal precursor layer 24. In another case, however, the first substrate 20 may be rotated upside down and disposed onto the second substrate 26. This way, the component distribution uniformity, like that of Ga component, in the first metal precursor layer 24 may be improved.

Figure 5:
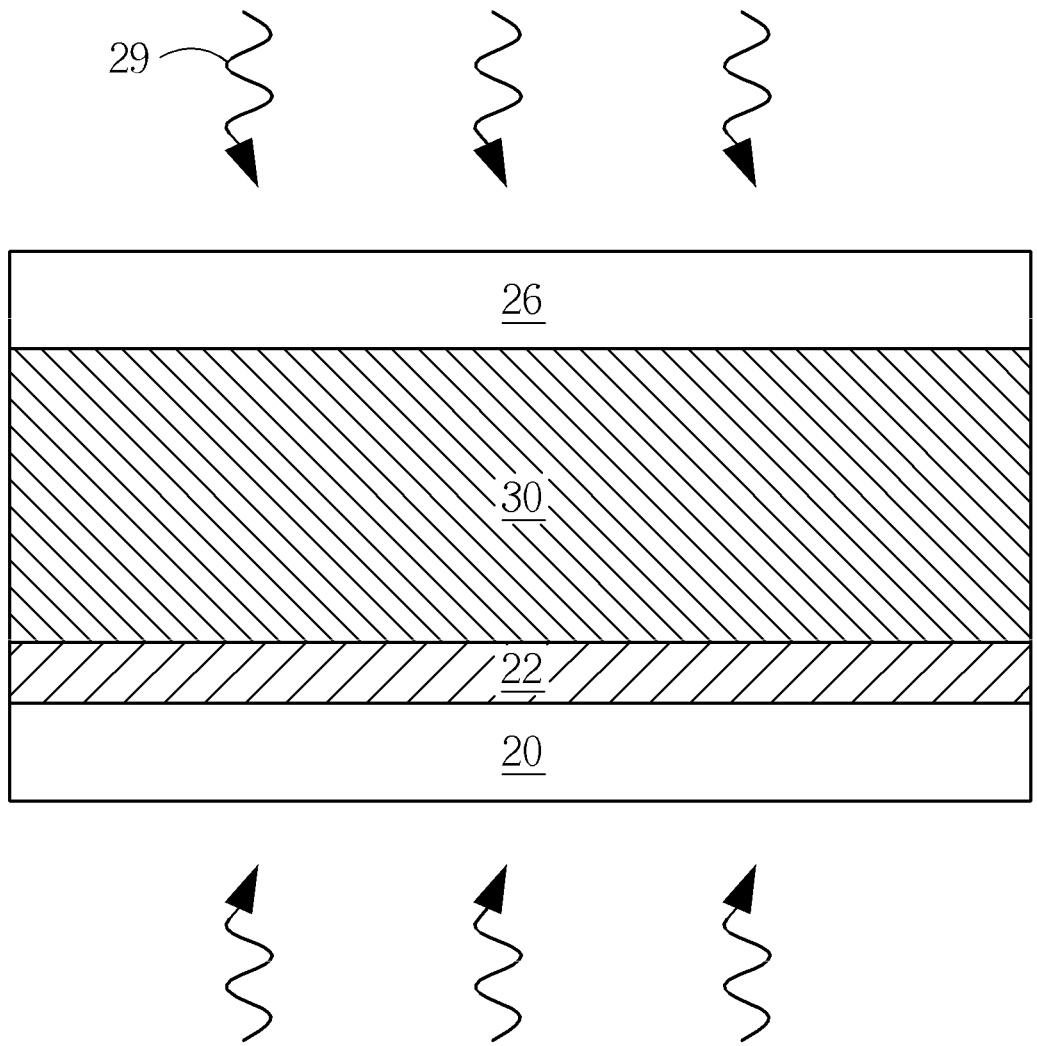

As shown in FIG. 5, a thermal treatment 29 is performed to have the first metal precursor layer 24 (as shown FIG. 4) react with the nonmetal precursor layer 28 (as shown FIG. 4) for forming an optoelectronic conversion layer 30. The optoelectronic conversion layer 30 is preferably thicker than 1.8 $\mu m$, between 1.8 $\mu m$ and 3 $\mu m$ for example, but is not limited thereto. Finally, the second substrate 26 is removed from the optoelectronic conversion layer 30. In this embodiment, when the first metal precursor layer 24 and the nonmetal component in the nonmetal precursor layer 28 are selected from copper-indium-gallium alloy precursor layer and Se element respectively, the optoelectronic conversion layer 30 will be a copper-indium-gallium-selenide (CIGS) layer with chalcopyrite structures after performing the thermal treatment. In another embodiment, when the first metal precursor layer 24 and the nonmetal component in the nonmetal precursor layer 28 are selected from copper-zinc-tin alloy precursor layer and Sulfur element respectively, the optoelectronic conversion layer 30 will be a copper zinc tin sulfide (CZTS) layer after performing the thermal treatment. In yet another embodiment, when the first metal precursor layer 24 and the nonmetal component in the nonmetal precursor layer 28 are selected from Cd precursor layer and Te element respectively, the optoelectronic conversion layer 30 will be a cadmium telluride (CaTe) layer after the thermal treatment.

In this embodiment, the thermal treatment may include a multistage rapid thermal treatment. According to this embodiment, for example, the multistage rapid thermal treatment may include performing a low temperature thermal treatment and a high temperature thermal treatment sequentially. The main purpose of the low temperature thermal treatment is to diffuse the selenium element into the copper-indium-gallium alloy for example. A processing temperature and a processing duration of the low temperature thermal treatment approximately range from 80° C. to 140° C. (preferably 140° C.) and from 15 minutes to 20 minutes respectively, but not limited thereto. On the other hand, the main purpose of the high temperature thermal treatment is to have the Se react with the copper-indium-gallium alloy for example, to thereby form a copper indium gallium (di) selenide layer. A processing temperature and a processing duration of the high temperature thermal treatment approximately ranges from 500° C. to 560° C. (preferably 550° C.) and is approximate less than 10 min (preferably 5 min) respectively, but are not limited thereto. Optionally, the multistage rapid thermal treatment may further comprise a medium temperature thermal treatment performed between the low temperature thermal treatment and the high temperature thermal treatment. A processing temperature and a processing duration of the medium temperature thermal treatment approximately ranges from 330° C. to 480° C. (preferably 450° C.) and is approximately less than 10 min (preferably 5 min) respectively, but are not limited thereto. The thermal treatment described in the embodiments is not limited to the multistage rapid thermal treatment; it may also be replaced with a single stage rapid thermal treatment or other kinds of thermal treatments.

Methods of forming the optoelectronic conversion layer are not restricted to the preceding embodiments. Several feasible methods for forming an optoelectronic conversion layer will be disclose in the following paragraphs. For brevity purposes, like or similar features in multiple embodiments will usually be described with similar reference numerals for ease of illustration and description thereof.

Figure 6:
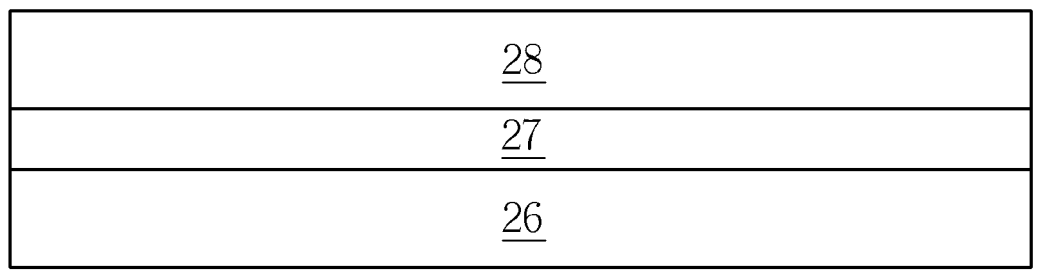
FIG. 6 is a schematic, cross-sectional diagram showing a method for forming an optoelectronic conversion layer according to a modified first embodiment of the invention.

Please refer to FIG. 6. FIG. 6 is a schematic, cross-sectional diagram showing a method for fabricating an optoelectronic conversion layer according to a modified first embodiment of the invention. As shown in FIG. 6, according to this modified embodiment, a second metal precursor layer 27 is formed on the second substrate 26 before forming the nonmetal precursor layer on the second substrate 26. The second metal precursor layer 27, for example, comprises at least a metal component, like Ga, Cu or gallium copper alloy, but is not limited thereto. The second metal precursor layer 27 may be a single-layered metal precursor layer, such as a single metal element precursor layer or an alloy precursor layer. The second metal precursor layer 27 may also be a multi-layered metal precursor layer comprising several layers of metal precursor films. Each of the metal precursor films may be a single metal element precursor film or an alloy precursor film.

Figure 7:
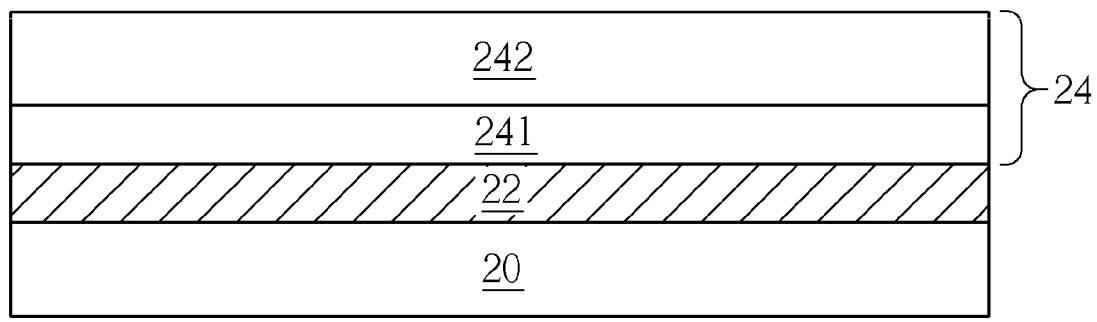
FIG. 7 is a schematic, cross-sectional diagram showing a method for forming an optoelectronic conversion layer according to a second embodiment of the invention.

Please refer to FIG. 7, which is a schematic, cross-sectional diagram showing a method for fabricating an optoelectronic conversion layer according to a second embodiment of the invention. As shown in FIG. 7, unlike the first embodiment, the first metal precursor layer 24 may comprise a multi-layered metal precursor layer including several layers of metal precursor films stacked with each other. For example, when metal components in the first metal precursor layer 24 include In, Cu and Ga, the multi-layered metal precursor layer may comprise a first metal precursor film 241 and a second metal precursor film 242. The first metal precursor film 241 may be an In precursor film or an indium gallium alloy precursor film, but is not limited thereto. The second metal precursor film 242 may be copper gallium alloy precursor film, but is not limited thereto. Or, in another case, when metal components in the first metal precursor layer 24 include Cu, Zn and Sn, the first metal precursor film 241 and the second metal precursor film 242 may be a metal precursor film or an alloy precursor film selected from the metal components (i.e. Cu, Zn and Sn) respectively.

Figure 8:
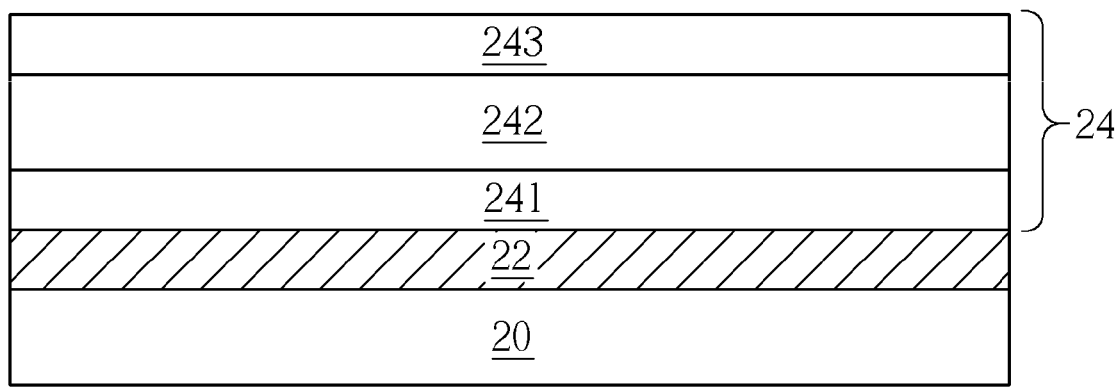
FIG. 8 is a schematic, cross-sectional diagram showing a method for forming an optoelectronic conversion layer according to a modified second embodiment of the invention.

Please refer to FIG. 8, which is a schematic, cross-sectional diagram showing a method for fabricating an optoelectronic conversion layer according to a modified second embodiment of the invention. As shown in FIG. 8, in this modified embodiment, the first metal precursor layer 24 may comprise a multi-layered metal precursor layer including several layers of metal precursor films stacking with each other. For example, when metal components in the first metal precursor layer 24 include In, Cu and Ga, the multi-layered metal precursor layer may comprise a first metal precursor film 241, a second metal precursor film 242 and a third metal precursor film 243. The first metal precursor film 241 may be an In precursor film. And the second metal precursor film 242 and the third metal precursor film 243 may be a Cu precursor film and Ga precursor film respectively, but are not limited thereto. In another embodiment, each of the first metal precursor film 241, the second metal precursor film 242 and the third metal precursor film 243 may be a metal precursor film or an alloy precursor film respectively.

Figure 9:
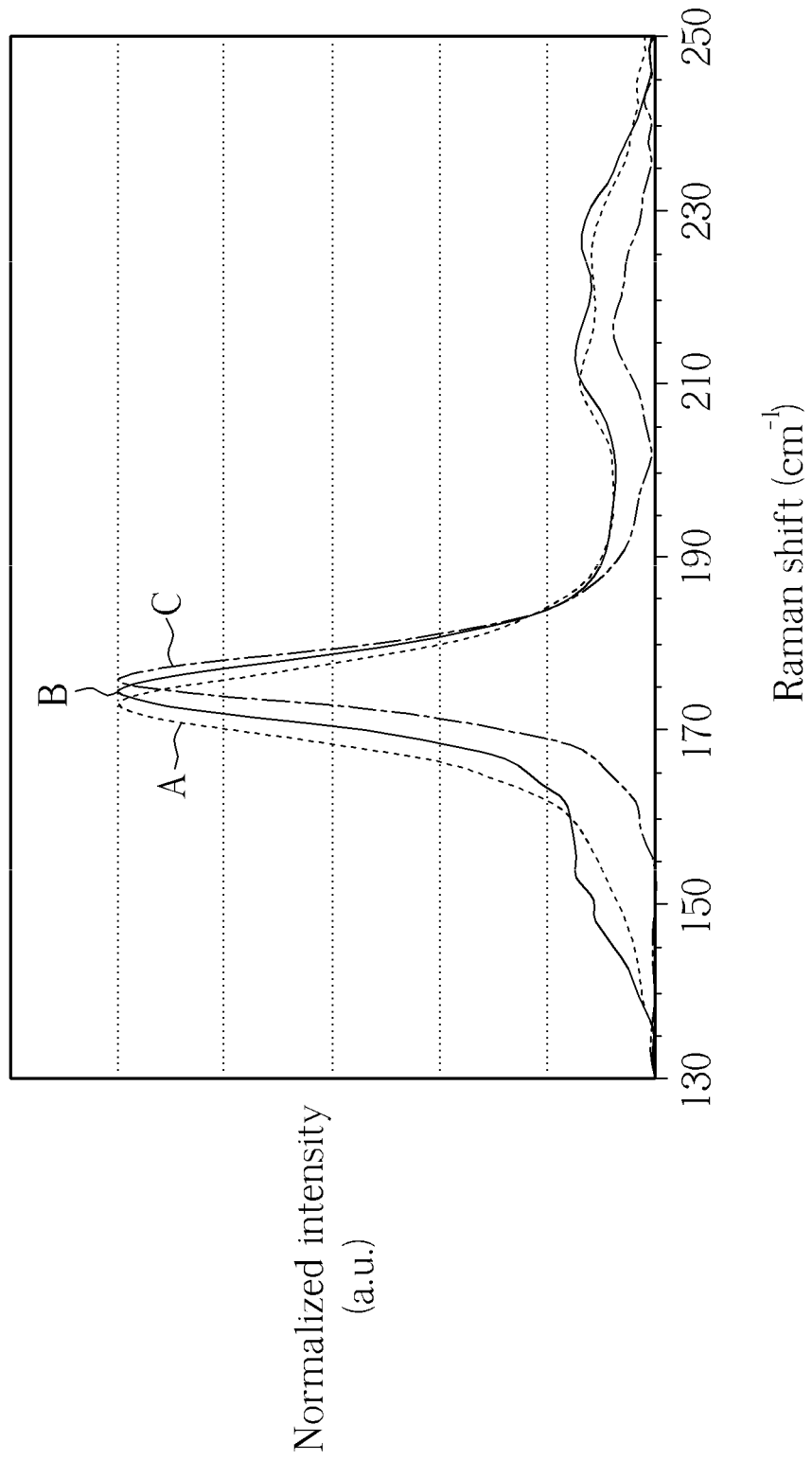
FIG. 9 is a Raman spectrum of a copper-indium-gallium-selenide layer in a copper-indium-gallium-selenide layer fabricated by a method illustrated in the present invention.

As shown in FIG. 9 and by reference to FIG. 5, FIG. 9 is a Raman spectrum of a copper-indium-gallium-selenide in a copper-indium-gallium-selenide layer fabricated by the methods illustrated in the present invention, where the abscissa and ordinate of the diagram represent the Raman shift (cm$^{-1}$) and the normalized intensity respectively. Several curves in the FIG. 9 are illustrated as follows: the curve A is the Raman spectrum of the copper-indium-gallium-selenide layer of a control group; the curve B is the Raman spectrum of the copper-indium-gallium-selenide layer of an experimental group according to the first embodiment; and the curve C is the Raman spectrum of the copper-indium-gallium-selenide layer in an experimental group according to the modified first embodiment. When comparing the curve A to the curves B and C, it shows that the amount of the Ga nearby the surface of the optoelectronic conversion layer 30 fabricated by the invention is higher than that of the Ga nearby the surface of an optoelectronic conversion layer 30 in the control group. That is to say, according to the invention, the energy bandgap of the copper-indium-gallium-selenide layer near the surface of the optoelectronic conversion layer 30 keeps a high value compared to the control group. Therefore, a $V_{os}$ of solar cells fabricated by the invention may be effectively increased.

Figure 10:
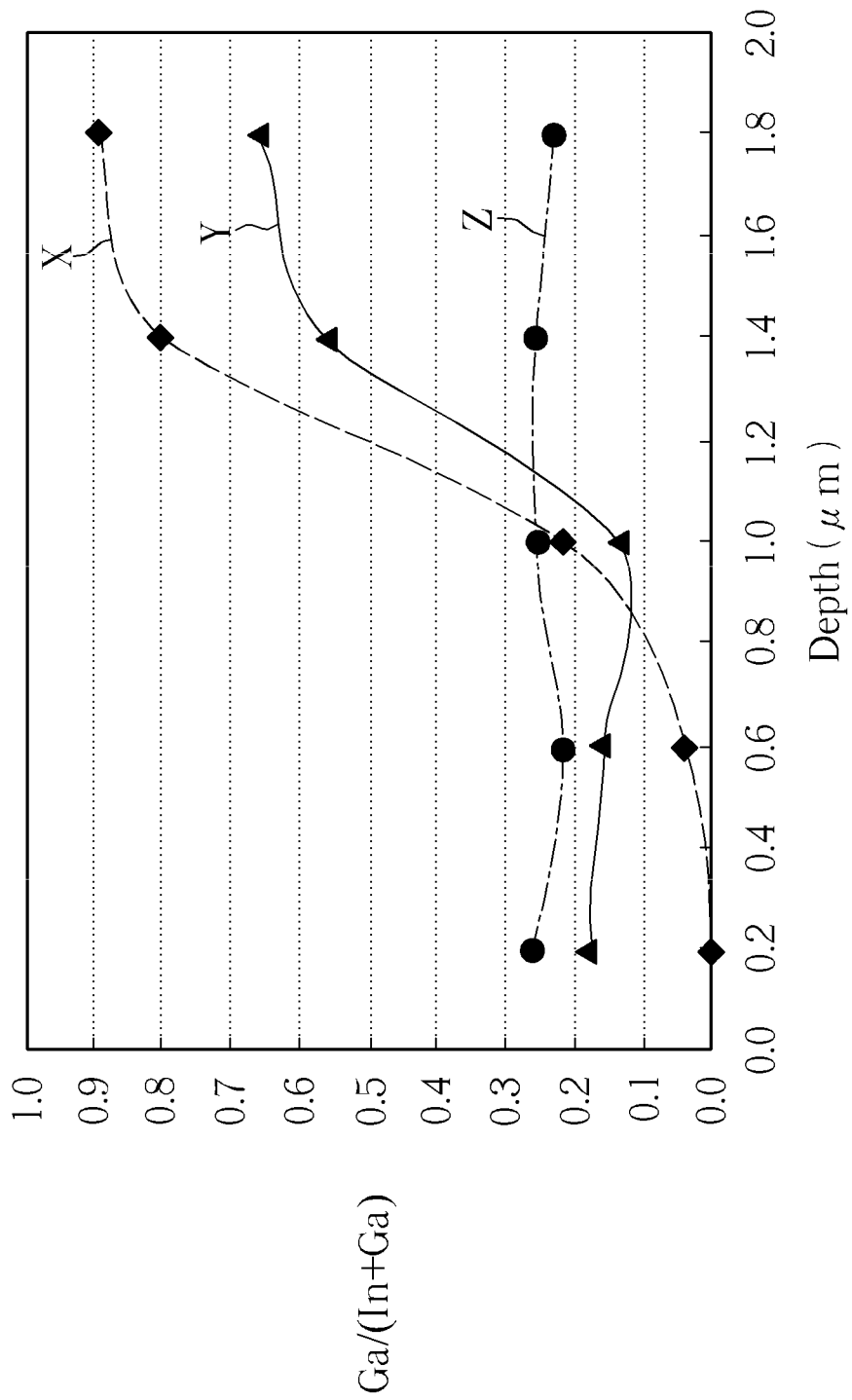
FIG. 10 is a diagram demonstrating a relationship between Ga/(In+Ga) atomic ratio and depth in a copper-indium-gallium-selenide layer fabricated by a method illustrated in the present invention.

Please refer to FIG. 10 and FIG. 5. FIG. 10 shows a diagram demonstrating a relationship between a Ga/(In+Ga) atomic ratio and a depth in a copper-indium-gallium-selenide layer fabricated by the method illustrated in the present invention, where the abscissa represents the depth relatively to a surface of the optoelectronic conversion layer 30; and the ordinate of the diagram represents the related Ga/(In+Ga) atomic ratio. Similarly, several curves in the FIG. 10 illustrate as follows: the curve X represents a relationship between the Ga/(In+Ga) atomic ratio and the depth in a copper-indium-gallium-selenide layer in a control group; the curve Y represents a relationship between the Ga/(In+Ga) atomic ratio and the depth in a copper-indium-gallium-selenide layer in an experimental group according to the first embodiment; the curve Z represents a relationship between the Ga/(In+Ga) atomic ratio and the depth in a copper-indium-gallium-selenide layer in an experimental group according to the modified first embodiment. In FIG. 10, the distribution gradient of Ga in the copper-indium-gallium-selenide layer according to the invention is smoother than that in the control group. Accordingly, the optoelectronic conversion efficiency is improved.

To sum up, the method of forming an optoelectronic conversion layer according the invention comprises forming a first metal precursor layer on a first substrate and forming a nonmetal precursor layer on a second substrate separately. Then, the first substrate is stacked with the second substrate so that the first metal precursor layer is in direct contact with the nonmetal precursor layer. Finally, a thermal treatment is carried out so that the first metal precursor layer can react with the nonmetal precursor to form an optoelectronic conversion layer. The method illustrated in the above embodiments may be applied in a fabrication for large-scale device and the distribution uniformity of each component in the optoelectronic conversion layer may also be improved, which increases the open-circuit voltage ($V_{os}$) and therefore improve the optoelectronic conversion efficiency. Additionally, when the optoelectronic conversion layer is copper-indium-gallium-selenide layer, it is also cost-effective because of an increased utilization ratio of Se. Furthermore, the method is environmental-friendly since no toxic gas is used, like hydrogen selenide ($H_2Se$).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an optoelectronic conversion layer, comprising:
   providing a first substrate, and forming an electrode layer on the first substrate;
   forming a first metal precursor layer on the electrode layer, wherein the first metal precursor layer comprises one or a plurality of metal components;
   providing a second substrate, and forming a nonmetal precursor layer on the second substrate, wherein the nonmetal precursor layer comprises at least one kind of nonmetal component;
   forming a second metal precursor layer on the second substrate before forming the nonmetal precursor layer on the second substrate;
   stacking the first substrate and the second substrate so that the nonmetal precursor layer is in contact with the first metal precursor layer; and
   performing a thermal treatment to react the first metal precursor layer with the nonmetal precursor layer for forming an optoelectronic conversion layer.

2. The method of forming the optoelectronic conversion layer according to claim 1, wherein the first metal precursor layer is formed by a sputter deposition process.

3. The method of forming the optoelectronic conversion layer according to claim 1, wherein the nonmetal precursor layer is formed by an evaporation deposition process.

4. The method of forming the optoelectronic conversion layer according to claim 1, wherein the first substrate and the second substrate comprise a soda-lime glass substrate, respectively.

5. The method of forming the optoelectronic conversion layer according to claim 1, wherein the first metal precursor layer comprises a single-layered metal precursor layer.

6. The method of forming the optoelectronic conversion layer according to claim 5, wherein the single-layered metal precursor layer is a single metal element precursor layer.

7. The method of forming the optoelectronic conversion layer according to claim 5, wherein the single-layered metal precursor layer is an alloy precursor layer.

8. The method of forming the optoelectronic conversion layer according to claim 1, wherein the first metal precursor layer comprises a multi-layered metal precursor layer comprising a plurality of metal precursor films stacked with each other.

9. The method of forming the optoelectronic conversion layer according to claim 8, wherein at least one of the metal precursor films in the multi-layered metal precursor layer is a single metal element precursor layer.

10. The method of forming the optoelectronic conversion layer according to claim 8, wherein at least one of the metal precursor films in the multi-layered metal precursor layer is an alloy precursor layer.

11. The method of forming the optoelectronic conversion layer according to claim 1, wherein the metal components in the first metal precursor layer comprise at least one kind of group B metal element, and the nonmetal component in the nonmetal precursor layer comprises a kind of group A nonmetal element.

12. The method of forming the optoelectronic conversion layer according to claim 11, wherein the metal components in the first metal precursor layer comprise indium (In), copper (Cu) and gallium (Ga), and the nonmetal component in the nonmetal precursor layer comprises selenium (Se).

13. The method of forming the optoelectronic conversion layer according to claim 12,
   wherein the second metal precursor layer comprises at least one kind of metal component comprising gallium (Ga).

14. The method of forming the optoelectronic conversion layer according to claim 11, wherein the metal components in the first metal precursor layer comprise copper (Cu), zinc (Zn) and tin (Sn), and the nonmetal component in the nonmetal precursor layer comprises sulfur (S).

15. The method of forming the optoelectronic conversion layer according to claim 11, wherein the metal components in the first metal precursor layer comprise cadmium (Cd), and the nonmetal component in the nonmetal precursor layer comprises tellurium (Te).

16. The method of forming the optoelectronic conversion layer according to claim 1, wherein the thermal treatment comprises a multistage rapid thermal treatment or a single stage thermal treatment.

17. The method of forming the optoelectronic conversion layer according to claim 16, wherein the multistage rapid thermal treatment comprises performing a low temperature thermal treatment and a high temperature thermal treatment sequentially.

18. The method of forming the optoelectronic conversion layer according to claim 17, wherein a processing temperature and a processing duration of the low temperature thermal treatment ranges from 80° C. to 140° C. and from 15 minutes to 20 minutes respectively, and a processing temperature and a processing duration of the high temperature thermal treatment ranges from 500° C. to 560° C. and lasts less than 10 minutes respectively.

19. The method of forming the optoelectronic conversion layer according to claim 17, wherein the multistage rapid thermal treatment further comprises a medium temperature thermal treatment performed between the low temperature thermal treatment and the high temperature thermal treatment.

20. The method of forming the optoelectronic conversion layer according to claim 19, wherein a processing temperature and a processing duration of the medium temperature thermal treatment ranges from 330° C. to 480° C. and lasts less than 10 minutes.

21. The method of forming the optoelectronic conversion layer according to claim 1, wherein the second substrate is disposed on the first substrate when performing the thermal treatment.

22. A method of forming an optoelectronic conversion layer, comprising:
   providing a first substrate, and forming an electrode layer on the first substrate;

forming a first metal precursor layer on the electrode layer, wherein the first metal precursor layer comprises a single-layered metal precursor layer, and the single-layered metal precursor layer is a single metal element precursor layer;

providing a second substrate, and forming a nonmetal precursor layer on the second substrate, wherein the nonmetal precursor layer comprises at least one kind of nonmetal component;

stacking the first substrate and the second substrate so that the nonmetal precursor layer is in contact with the first metal precursor layer; and performing a thermal treatment to react the first metal precursor layer with the nonmetal precursor layer for forming an optoelectronic conversion layer.

* * * * *